(12) United States Patent
Kim

(10) Patent No.: US 8,384,104 B2
(45) Date of Patent: Feb. 26, 2013

(54) LIGHT EMITTING DEVICE, LIGHT EMITTING DEVICE PACKAGE AND LIGHTING SYSTEM INCLUDING THE SAME

(75) Inventor: Sun Kyung Kim, Yongin-si (KR)

(73) Assignee: LG Innotek Co., Ltd., Seoul (KR)

( * ) Notice: Subject to any disclaimer, the term of this patent is extended or adjusted under 35 U.S.C. 154(b) by 209 days.

(21) Appl. No.: 12/720,013

(22) Filed: Mar. 9, 2010

(65) Prior Publication Data
US 2010/0230701 A1 Sep. 16, 2010

(30) Foreign Application Priority Data
Mar. 10, 2009 (KR) .................. 10-2009-0020193

(51) Int. Cl.
  *H01L 33/14* (2010.01)
  *H01L 33/20* (2010.01)
(52) U.S. Cl. ............ 257/98; 257/E33.068; 257/E33.074
(58) Field of Classification Search .................. None
  See application file for complete search history.

(56) References Cited

U.S. PATENT DOCUMENTS

| | | | | |
|---|---|---|---|---|
| 5,779,924 | A * | 7/1998 | Krames et al. .................. | 216/24 |
| 6,420,732 | B1 * | 7/2002 | Kung et al. ..................... | 257/79 |
| 8,237,184 | B2 * | 8/2012 | Kuo ................................. | 257/98 |
| 2003/0127608 | A1 * | 7/2003 | Shields et al. ............. | 250/493.1 |
| 2004/0206969 | A1 | 10/2004 | Orita | |
| 2005/0025206 | A1 * | 2/2005 | Chen ............................... | 372/46 |
| 2005/0285132 | A1 * | 12/2005 | Orita .............................. | 257/99 |
| 2006/0091417 | A1 * | 5/2006 | Sugimoto et al. .............. | 257/99 |
| 2007/0071054 | A1 * | 3/2007 | Takahashi ..................... | 372/50.1 |
| 2007/0085093 | A1 * | 4/2007 | Ohmae et al. .................. | 257/89 |
| 2007/0153864 | A1 * | 7/2007 | Lidorikis et al. ......... | 372/50.124 |
| 2007/0257269 | A1 * | 11/2007 | Cho et al. ........................ | 257/95 |
| 2008/0017874 | A1 * | 1/2008 | Erchak et al. .................. | 257/94 |
| 2008/0061307 | A1 * | 3/2008 | Ikeda et al. ..................... | 257/94 |
| 2008/0135861 | A1 * | 6/2008 | Pokrovskiy et al. ............. | 257/98 |
| 2008/0135862 | A1 * | 6/2008 | Maeda et al. ................... | 257/98 |
| 2008/0173887 | A1 | 7/2008 | Baba et al. | |
| 2008/0251806 | A1 * | 10/2008 | Erchak ............................ | 257/98 |

(Continued)

FOREIGN PATENT DOCUMENTS

| CN | 101322255 | 12/2008 |
|---|---|---|
| KR | 10-2005-0029167 | 3/2005 |

(Continued)

OTHER PUBLICATIONS

Tutorial Thermophoresis of DNA, n.d. http://www.biosystems.physik.lmu.de/teaching/Binding_with_Thermophoresis.pdf.*

(Continued)

*Primary Examiner* — Thomas L Dickey
*Assistant Examiner* — Joseph Schoenholtz
(74) *Attorney, Agent, or Firm* — KED & Associates LLP

(57) ABSTRACT

A light emitting device, a light emitting device package and a lighting system including the same are provided. The light emitting device may include a light emitting structure, a dielectric pattern, a second electrode layer, and a resonator structure. The light emitting structure may include a first conductive type semiconductor layer, an active layer, and a second conductive type semiconductor layer. The dielectric pattern may be disposed on the second conductive type semiconductor layer. The second electrode layer may be disposed on the second conductive type comprising the dielectric pattern. The resonator structure may be disposed on the light emitting structure.

14 Claims, 11 Drawing Sheets

U.S. PATENT DOCUMENTS

| | | | |
|---|---|---|---|
| 2009/0026478 | A1 | 1/2009 | Yoon et al. |
| 2009/0045427 | A1* | 2/2009 | Wierer et al. ............. 257/98 |
| 2009/0278145 | A1 | 11/2009 | Sakai |
| 2010/0012969 | A1 | 1/2010 | Yoon et al. |

FOREIGN PATENT DOCUMENTS

| | | |
|---|---|---|
| KR | 10-2005-0082518 | 8/2005 |
| KR | 10-0652346 | 11/2006 |
| KR | 10-0700530 | 3/2007 |

OTHER PUBLICATIONS

Holtslag, A. H. M., and P. M. L. O. Scholte. "Optical Measurement of the Refractive Index, Layer Thickness, and Volume Changes of Thin Films." Applied Optics 28.23 (1989): 5095.*

Wei, Zhang. "Analysis and Simulation of the Direction of Arrival Estimation Algorithm of Spatial Signal." The Eighth International Conference on Electronic Measurement and Instruments 2 (2007): 576-79.*

Yoshioka, Shinya. "Direct Determination of the Refractive Index of Natrual Multi-layer Systems." Physical Review E 83 (2011): 051917-1-51917-7.*

Stahl, O., K. Weis, D. J. Bomans, K. Davidson, T. R. Gull, and R. M. Humphreys. "A Spectroscopic Event of n Car Viewed from Different directions: The Data and First Results." Astronomy and Astrophysics 435.1 (2005): 303-12.*

Korean Office Action dated Jun. 29, 2010.

Chinese Office Action dated Apr. 18, 2012.

* cited by examiner

LIGHT EMITTING DEVICE, LIGHT EMITTING DEVICE PACKAGE AND LIGHTING SYSTEM INCLUDING THE SAME

This application claims priority under 35 U.S.C. §119 to Korean Patent Application No. 10-2009-0020193, filed in Korea on Mar. 10, 2009, which is hereby incorporated by reference in its entirety.

BACKGROUND

1. Field

A light emitting device, a light emitting device package and a lighting system including the same are disclosed herein.

2. Background

Light emitting devices are known. However, they suffer from various disadvantages.

BRIEF DESCRIPTION OF THE DRAWINGS

Embodiments will be described in detail with reference to the following drawings in which like reference numerals refer to like elements, and wherein.

DETAILED DESCRIPTION

Figure 1:
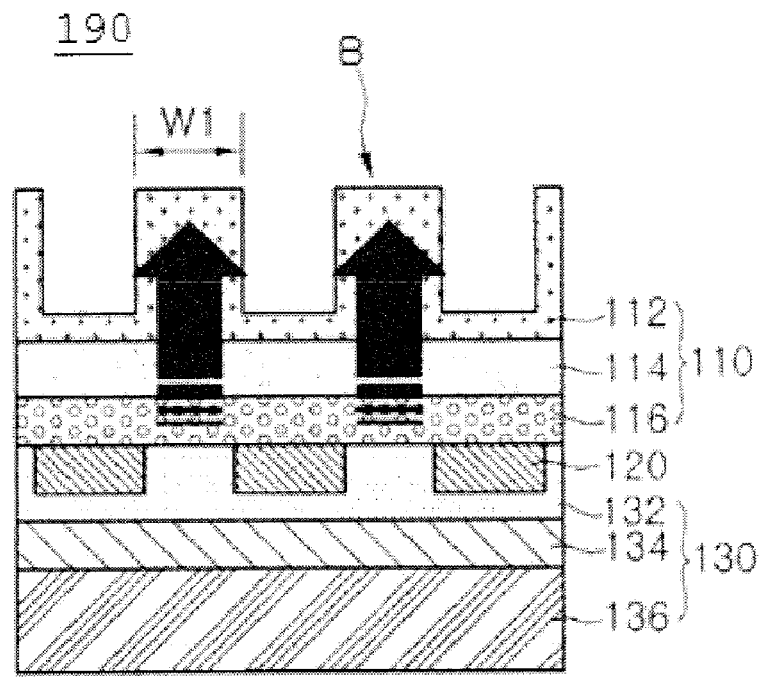
FIG. 1 is a cross-sectional view of a light emitting device according to an embodiment.

Hereinafter, a light emitting device, a light emitting device package and a lighting system including the same according to embodiments will be described in detail with reference to the accompanying drawings. Where possible, like reference numerals have been used to indicate like elements.

In the description of embodiments, it should be understood that when a layer (or film) is referred to as being 'on' another layer or substrate, it may be directly on another layer or substrate, or intervening layers may also be present. Further, it should be understood that when a layer is referred to as being 'under' another layer, it may be directly under another layer, and one or more intervening layers may also be present. In addition, it should also be understood that when a layer is referred to as being 'between' two layers, it may be the only layer between the two layers, or one or more intervening layers may also be present.

Nitride semiconductors are attracting much attention for the fields of optical devices and high-power electronic devices because of their high thermal stability and wide band gap energy. In particular, blue LEDs, green LEDs, and UV LEDs that use nitride semiconductors have been commercialized and are widely used.

The efficiency of a light emitting device may be categorized into external quantum efficiency and internal quantum efficiency. The external quantum efficiency refers to a probability that light generated from an active layer is emitted outside a device. According to the related art, external quantum efficiency is reduced in value due to a total reflection due to a difference in refractive index between a semiconductor layer and a background material, such as air or epoxy.

As a method for enhancing the external quantum efficiency, the following two concepts may be considered. First, a roughness or periodic uneven structure may be adopted on a boundary surface of a semiconductor layer. Second, a resonator effect, such as a resonant cavity LED, may be used.

The method of modifying a boundary surface of a semiconductor layer using a roughness or periodic uneven structure may include extracting light restrained by a total reflection process to the outside. On the other hand, the method of using the resonator effect, which is a method of controlling a direction of light generated from an active layer through a natural mode of a resonator, has advantages in that extraction efficiency may be enhanced and directivity of light may be controlled.

However, a size of a device is required to be small to apply the resonator effect to a structure of a light emitting device. The light emitting device may be compared to a waveguide. For example, if a vertical LED is compared to a waveguide, then a reflection layer and an epoxy having low refractive indexes may correspond to a cladding and a light emitting structure may correspond to a core. In this case, the principle of the resonant cavity LED is to extract light to the outside through a combination of a resonator mode and an LED light, which is possible only when the number of resonator modes is small.

Looking at an effective refractive index of a waveguide mode according to a thickness of a light emitting structure which corresponds to a core in the related-art, if a size of a light emitting device increases according to a thickness of the light emitting structure, for example, an GaN semiconductor layer, the number of resonator modes increases, resulting in the same condition as if there is no resonator. That is, as the thickness of the GaN semiconductor layer increases, new higher order modes are emerging.

Figure 2:
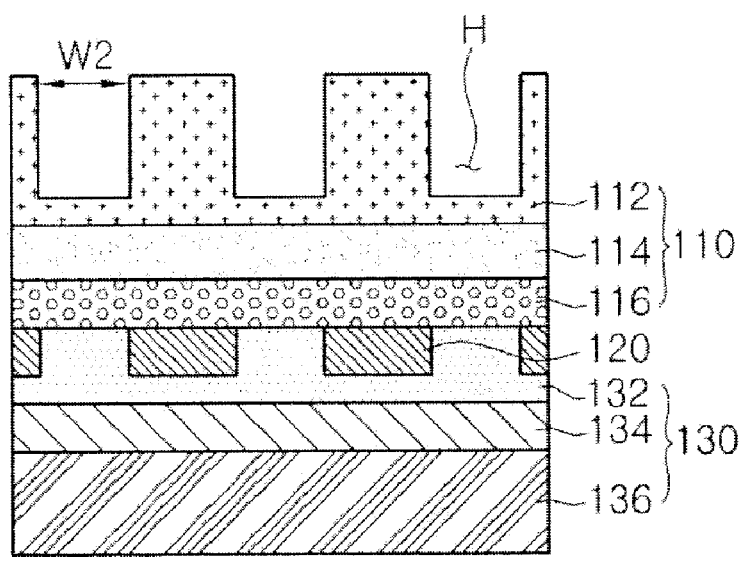
FIG. 2 is a cross-sectional view of a light emitting device according to another embodiment.

FIGS. 1 and 2 are cross-sectional views of light emitting devices according to embodiments. Referring to FIGS. 1 and 2, a light emitting device 190 may include a light emitting structure 110, a current blocking layer, a second electrode layer 130, and a light extraction pattern. In one embodiment, the current blocking layer 120 may include a dielectric pattern; however, embodiments are not limited thereto. Also, the light extraction pattern may include a resonator structure; however, embodiments are not limited thereto.

The light emitting structure 110 may include a first conductive type semiconductor layer 112, an active layer 114, and a second conductive type semiconductor layer 116. The dielectric pattern 120 may be disposed on the second conductive type semiconductor layer 116. The resonator structure may be disposed or formed in the light emitting structure 110.

FIG. 1 is a cross-section view of a light emitting device according to an embodiment, where the resonator structure has a cylindrical pattern B. FIG. 2 is a cross-sectional view of a light emitting device according to another embodiment, where the resonator structure has a hole or recess pattern H.

The dielectric pattern 120 allows current to flow in regions of the active layers 114 under the cylindrical pattern B (see FIG. 1) and the hole or recess pattern H (see FIG. 2), so that light may be generated from only the regions of the active layers. Thus, the light generated from the regions of the active layers under the cylindrical pattern B or the hole pattern H recognizes the cylindrical pattern B or the hole pattern H as a single resonator, thereby enhancing extraction efficiency through the resonator effect.

According to one embodiment, since the cylindrical pattern B and the dielectric pattern 120 are positioned in a pattern filling a total surface of the device, it can be viewed as if a plurality of resonator light emitting devices are separated from each other.

Computational modeling may be performed on a change of light emitting distribution according to whether a resonator structure, such as a cylindrical pattern exists, based on an electromagnetic equation. According to the computational modeling, when a resonator structure is not used, a spherical wave without directivity propagates along a medium. On the other hand, as a light emitting distribution chart would show in a case in which a resonator structure is introduced or used in a light emitting device according to an embodiment, if a cylindrical pattern structure approaches an active layer region, then a change of a light emitting distribution occurs, and light is emitted in a vertical direction mainly along an inside of the cylindrical pattern. In embodiments, a light source may be applied under a center of the cylindrical pattern to show local current by the dielectric pattern 120 in computational modeling.

Figure 3:
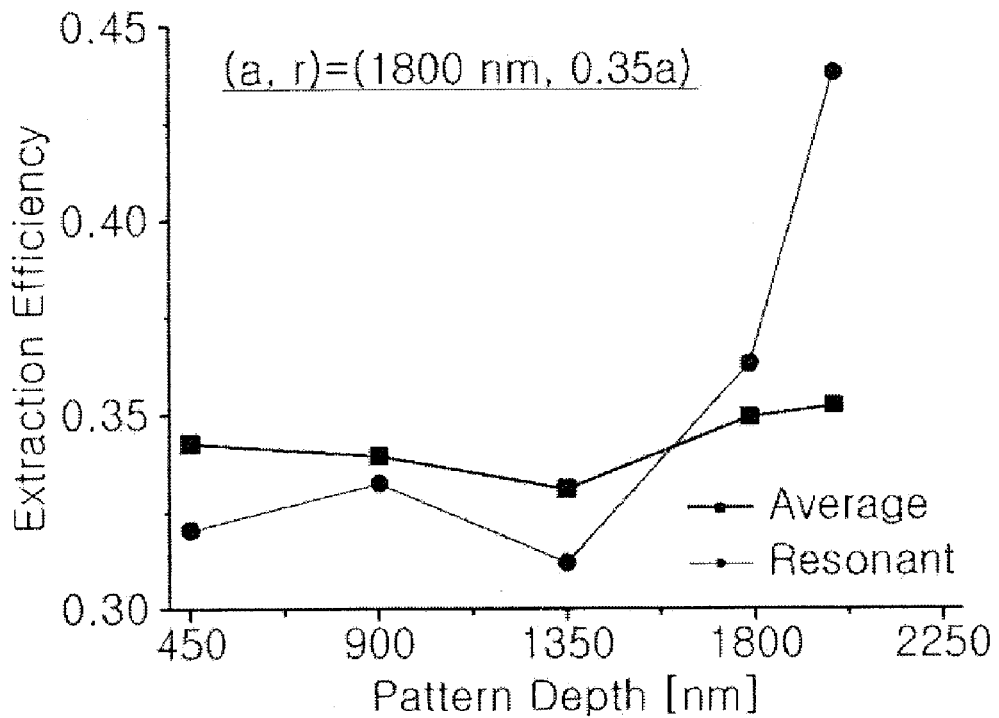
FIG. 3 is a graph illustrating a change of light extraction efficiency in a case in which a light source is applied under a resonator structure and in a case in which a light source is applied to a total active layer region.

FIG. 3 is a graph illustrating a change of light extraction efficiency according to a depth of a cylindrical pattern in a case where a light source is applied under the cylindrical pattern, a resonator structure (Resonant), and in a case in which a light source is applied to the total active layer (Average) region, where a is a period of the cylindrical pattern B, and r is a radius of the cylindrical pattern B. When a light source is applied to the total active layer region (Average), the extraction efficiency is constantly maintained regardless of a height of the cylindrical pattern. On the other hand, when a light source is applied under a center of a resonator structure (Resonant), extraction efficiency increases as a depth of the cylindrical pattern increases. More particularly, a bottom of the cylindrical pattern approaches within a several multiple of a wavelength to the active layer.

The cylindrical pattern B or the hole pattern H may be formed in phase or out of phase with the dielectric pattern 120 to generate the resonator effect. With the resonator structure, the cylindrical pattern B is arranged in alignment with the dielectric pattern 120, as shown in FIG. 2, and an additional light extraction effect by a thin light emitting device may be expected because the active layer 114 under the thin first conductive type semiconductor layer 112 participates in a light emitting process.

On the other hand, the resonator structure, the cylindrical pattern B, or the hole pattern H may not be arranged in perfect alignment with or in perfectly spatial alignment with the dielectric pattern 120. A horizontal width of the dielectric pattern 120 may be greater or smaller than a horizontal width W1 of the cylindrical pattern B or a horizontal width W2 of the hole pattern H.

To obtain the resonator effect in this embodiment, the horizontal width W1 of the cylindrical pattern B or the horizontal width W2 of the hole pattern H may have values greater than a single mode transmission condition ($\lambda/n$), where $\lambda$ is a centric wavelength of the active layer 114, and n is a refractive index of the light emitting structure 110. Further, to obtain the resonator effect in this embodiment, the horizontal width W1 of the cylindrical pattern B or the horizontal width W2 of the hole pattern H may be smaller than a thickness of the light emitting structure 110.

The dielectric pattern 120 serving to adjust current density may be arranged in an appropriate position to generate the resonator effect. If a distance between a bottom of the cylindrical pattern B or the hole pattern H and the active layer 114 is too far, the active layer 114 may not sense the resonator. If the distance is too close, current diffusion may be difficult due to reduction of the first conductive type semiconductor layer 112, for example, a n-GaN layer.

Thus, the bottom of the cylindrical pattern B or the hole pattern H may not pass through the active layer 114. Also, the distance between the bottom of the cylindrical pattern B or the hole pattern H and the active layer 114 may be identical to or greater than about 10 nm, and may be identical to or smaller than about $5 \times \lambda/n$, where $\lambda$ is the centric wavelength of the active layer 114, and n is the refractive index of the light emitting structure 110.

In one embodiment, current flows in only a specific region, so that an active layer in a corresponding region may sense a resonator effect. If current flows in the entire light emitting region uniformly, the light emitting efficiency is constantly maintained regardless of an etching depth like the Average data of FIG. 3. To express a degree of current localization arithmetically, when it is considered ideal that no current flows in the active layer 114 over the dielectric pattern 120, an upper limit of the current localization may correspond to the case where current intrudes into about 50% of a vertical cross-section of the active layer over the dielectric pattern 120.

Hereinafter, a method of manufacturing a light emitting device according to an embodiment will be described in detail with reference to FIGS. 4 through 10. Hereinafter, a method of manufacturing the light emitting device according to an embodiment will be described as an example; however, embodiments are not limited thereto. For example, the method may also be applied to a light emitting device according to another embodiment. With this embodiment, a first substrate 100 may be removed after a light emitting structure 110 is formed on the first substrate 100; however, embodiments are not limited thereto. For example, a method of forming a light emitting structure 110 on a conductive substrate, such as a second electrode layer 130, may be applied.

Figure 4:
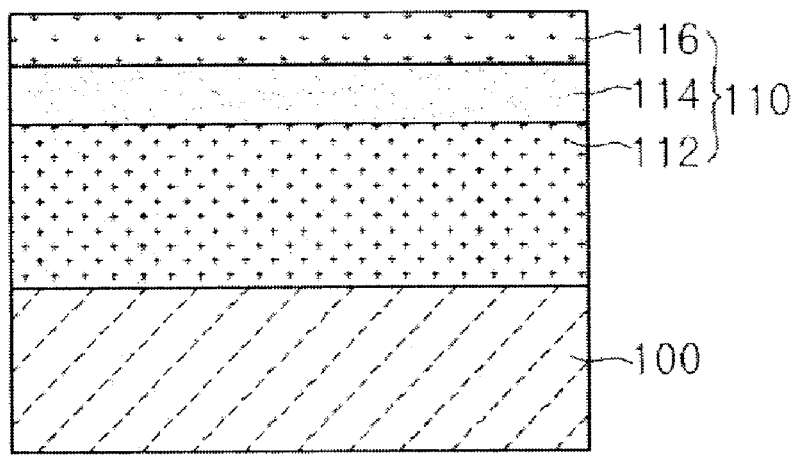
FIGS. 4 through 10 are cross-sectional views illustrating a method of manufacturing a light emitting device according to an embodiment.

Referring to FIG. 4, a light emitting structure 110 may be formed on a first substrate 100. The light emitting structure 110 may include a first conductive type semiconductor layer 112, an active layer 114, and a second conductive type semiconductor layer 116. An undoped semiconductor layer may be further formed between the first substrate 100 and the first conductive type semiconductor layer 112. Also, the light emitting structure 110 may be a GaN semiconductor layer; however, embodiments are not limited thereto.

The first substrate 100 may be a sapphire (Al2O3) single crystal substrate, or a SiC substrate; however, embodiments are not limited thereto. A wet-washing may be performed on the first substrate 100 to remove impurities.

The first conductive type semiconductor layer 112 may include an N-type GaN layer formed, for example, a Chemical Vapor Deposition (CVD) process, a Molecular Beam Epitaxy (MBE) process, a sputtering process, or a Hydride Vapor Phase Epitaxy (HVPE) process. The first conductive type semiconductor layer 112 may be formed by, for example, implanting a trimethyl gallium gas (TMGa), an ammonium gas (NH3), a nitrogen gas (N2), and a silane gas (SiH4) including an n-type impurity, such as silicon (Si), into a chamber.

The active layer 114 may be a layer emitting light having energy determined by an intrinsic energy band of an active layer (light emitting layer) material when electrons injected from the first conductive type semiconductor layer 112 meet holes injected from the second conductive type semiconductor layer 116. The active layer 114 may have, for example, a quantum well structure that is formed by alternate or successive lamination of nitride semiconductor thin layers having different energy bands. For example, the active layer 114 may be formed in a multi quantum well structure having an InGaN/GaN structure by being injected with a trimethyl gallium gas (TMGa), an ammonium gas (NH3), a nitrogen gas (N2), and a Trimethyl indium gas (TMIn); however, embodiments are not limited thereto.

The second conductive type semiconductor layer 116 may include a p-type GaN layer formed, for example, by implanting a trimethyl gallium gas (TMGa), an ammonium gas (NH3), a nitrogen gas (N2), and a bis-ethylcyclopentadienyl magnesium EtCp2Mg {Mg(C2H5C5H4)2} including a p-type impurity such as magnesium (Mg) into a chamber; however, embodiments are not limited thereto.

Figure 5:
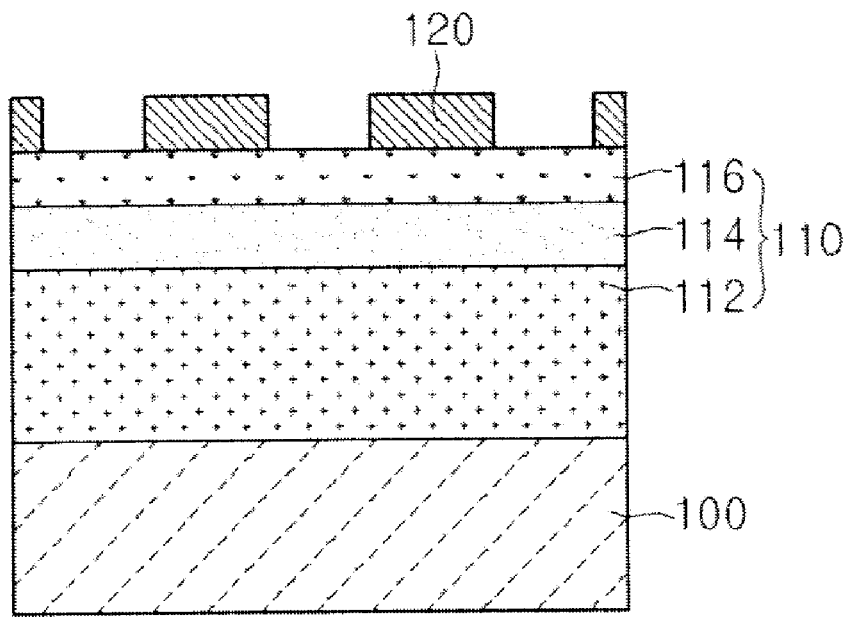

Referring to FIG. 5, a dielectric pattern 120 may be formed on the second conductive type semiconductor layer 116. For example, the dielectric pattern 120 may be formed by, for example, performing etching after forming a dielectric layer (not shown) and a first mask pattern (not shown) thereon. The dielectric pattern 120 may be a nonconductive material in which current does not flow. For example, the dielectric pattern may be formed of oxide and nitride; however, embodiments are not limited thereto. The dielectric pattern 120 may be formed in spatial alignment with a cylindrical pattern to be formed later; however, embodiments are not limited thereto.

Figure 6:
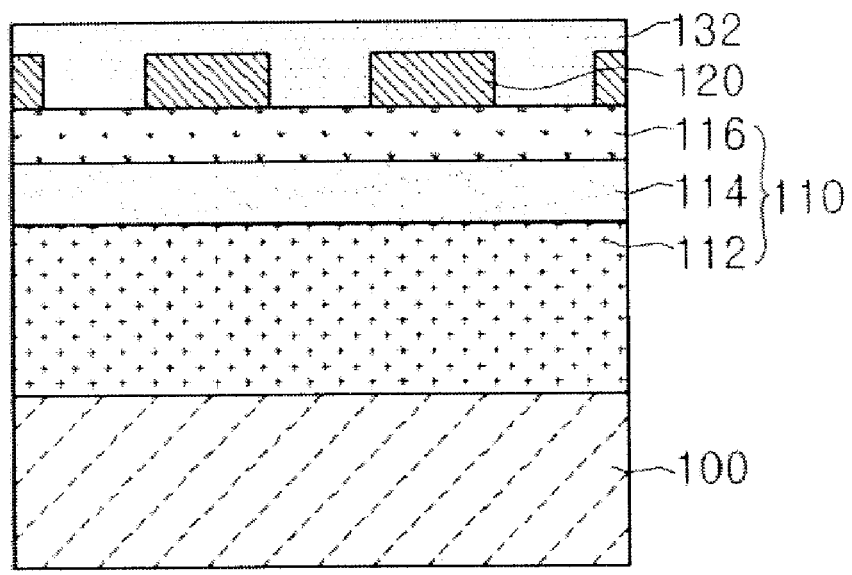

Next, a process of forming a second electrode layer 130 will be described. The second electrode layer 130 may include an ohmic layer 132, a reflection layer 134, an adhesion layer (not shown), and a second substrate 136. Referring to FIG. 6, the ohmic layer 132 may be formed on the second conductive type semiconductor layer 116, on which the dielectric layer 120 is formed.

The ohmic layer 132 may be formed, for example, by stacking a single metal, a metal alloy, and a metal oxide in a multi-layer to efficiently perform hole injection. For example, the ohmic layer 132 may include at least one of ITO, IZO (In—ZnO), ZnO, GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO; however, embodiments are not limited to these materials.

Figure 7:
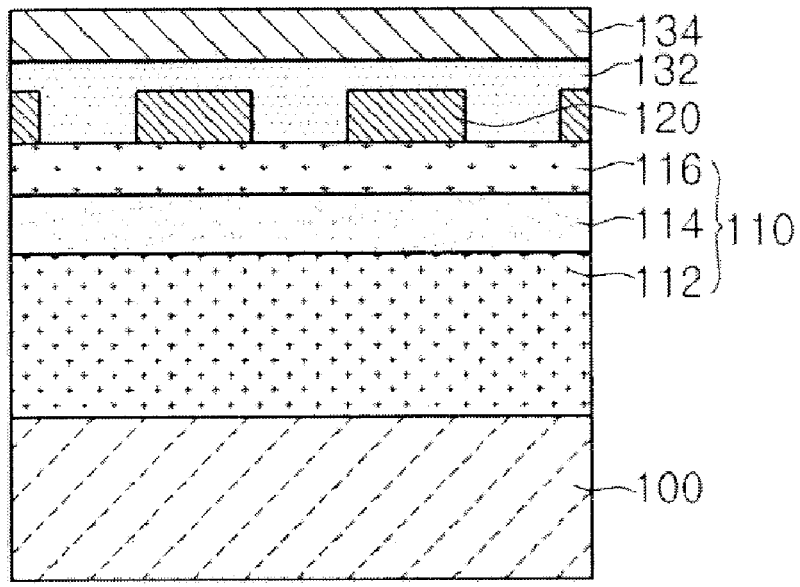

Referring to FIG. 7, the reflection layer 134 capable of performing a reflection function may be further formed on the ohmic layer 132. The reflection layer 134 may be formed of a metal layer including Al, Ag, or an alloy including Al or Ag; however, embodiments are not limited thereto.

Next, the second electrode layer 130 may include the adhesion layer (not shown). Also, the reflection layer 134 may serve as an adhesion layer. Alternatively, the adhesion layer may be formed, for example, using Ni, or Au.

Figure 8:
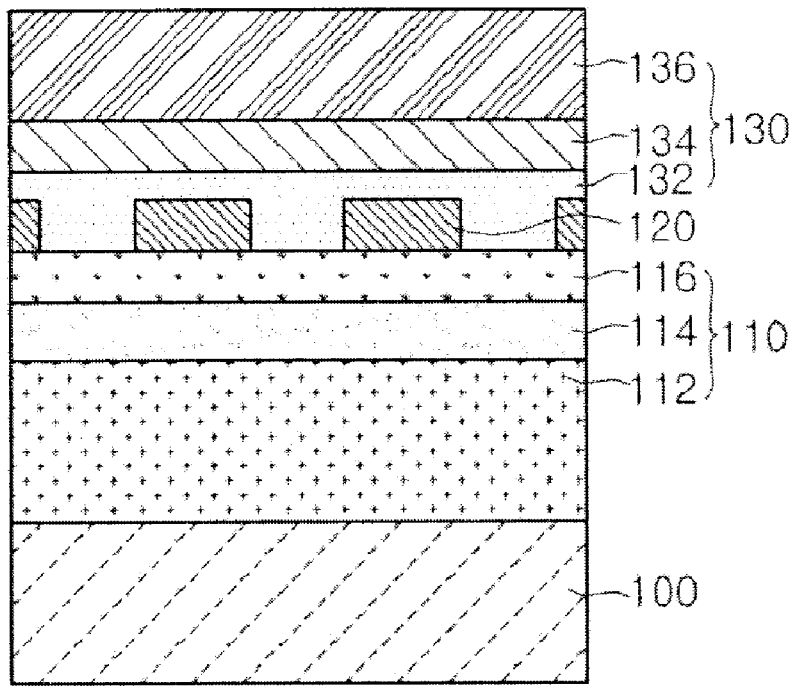

Referring to FIG. 8, the second electrode layer 130 may include a second substrate 136. If the first conductive type semiconductor layer 112 has a thickness of about 50 µm or more, a process of forming the second substrate 136 may be omitted. The second substrate 136 may be formed, for example, of a metal having excellent conductivity, a metal alloy, or a conductive semiconductor material to efficiently inject holes. For example, the second substrate 136 may be formed of Cu, Cu alloy, Si, Mo, and SiGe. The second substrate 136 may be formed by, for example, an electrochemical metal vapor deposition, or a bonding using, for example, an eutectic metal.

Figure 9:
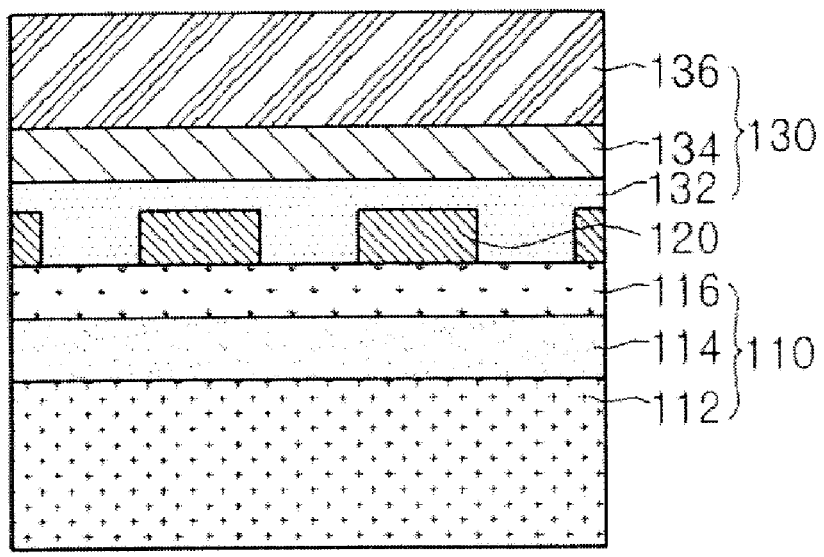

Referring to FIG. 9, the first substrate 100 may be removed to expose the first conductive type semiconductor layer 112.

The first substrate may be removed using, for example, a high-power laser, or a chemical etching method. The first substrate 100 may be removed by, for example, a physical polishing method. The first conductive type semiconductor layer 112 may be exposed by the removal of the first substrate 100. The exposed first conductive type semiconductor layer 112 may have a surface defect layer caused by the removal of the first substrate 100. The surface defect layer may be removed by, for example, a wet- or dry-etching method.

Figure 10:
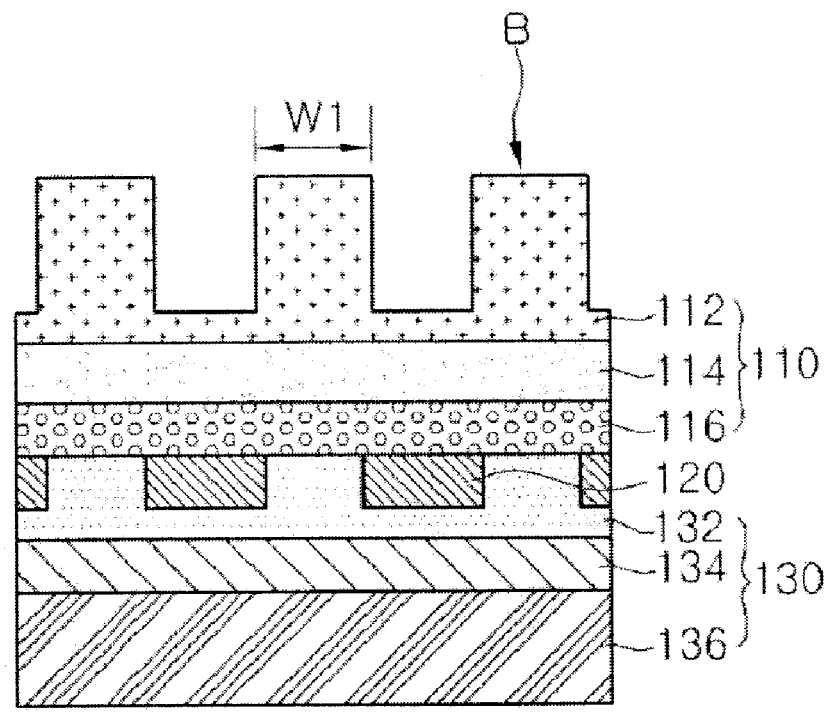

Referring to FIG. 10, a resonator structure may be formed at the light emitting structure 110. For example, the resonator structure may be formed on the first conductive type semiconductor layer 112; however, embodiments are not limited thereto. For example, the resonator structure may be formed at an undoped semiconductor layer (not shown), or may be formed at the undoped semiconductor and the first conductive type semiconductor layer 112.

The resonator structure may be a cylindrical pattern B; however, embodiments are not limited thereto. For example, the resonator structure may be a hole pattern as described in the previous embodiment.

After a second mask pattern (not shown) is formed, a portion of the first conductive type semiconductor layer 112 may be removed using the second mask pattern (not shown) to form the resonator structure. For example, an etching process may be performed to leave the first conductive type semiconductor layer 112 in spatial alignment with the dielectric pattern 120; however, embodiments are not limited thereto. For example, an etching process may be performed to leave the first conductive type semiconductor layer 112 in alignment with the dielectric pattern 120 as described in embodiments.

The resonator structure, the cylindrical pattern B, may not be arranged in perfect alignment with or in perfectly spatial alignment with the dielectric pattern 120. For example, the horizontal width of the dielectric pattern 120 may be smaller or greater than the horizontal width W1 of the cylindrical pattern B.

To obtain the resonator effect in this embodiment, the horizontal width W1 of the cylindrical pattern B or the horizontal width W2 of the hole pattern H may have values greater than the single mode transmission condition ($\lambda/n$), where $\lambda$ is the centric wavelength of the active layer 114, and n is the refractive index of the light emitting structure 110. Further, to obtain the resonator effect in this embodiment, the horizontal width W1 of the cylindrical pattern B or the horizontal width W2 of the hole pattern H may be smaller than the thickness of the light emitting structure 110.

The dielectric pattern 120 serving to adjust current density may be arranged in an appropriate position to generate the resonator effect. If a distance between the bottom of the cylindrical pattern B or the hole pattern H and the active layer 114 is too far, the active layer 114 may not sense the resonator. If the distance is too close, current diffusion is difficult due to reduction of the first conductive type semiconductor layer 112, for example, a n-GaN layer.

Thus, the bottom of the cylindrical pattern B or the hole pattern H may not pass through the active layer 114. Also, the distance between the bottom of the cylindrical pattern B or the hole pattern H and the active layer 114 may be identical to or greater than about 10 nm, and may be identical to or smaller than about $5 \times \lambda/n$, where $\lambda$ is the centric wavelength of the active layer 114, and n is the refractive index of the light emitting structure 110.

Figure 11A:
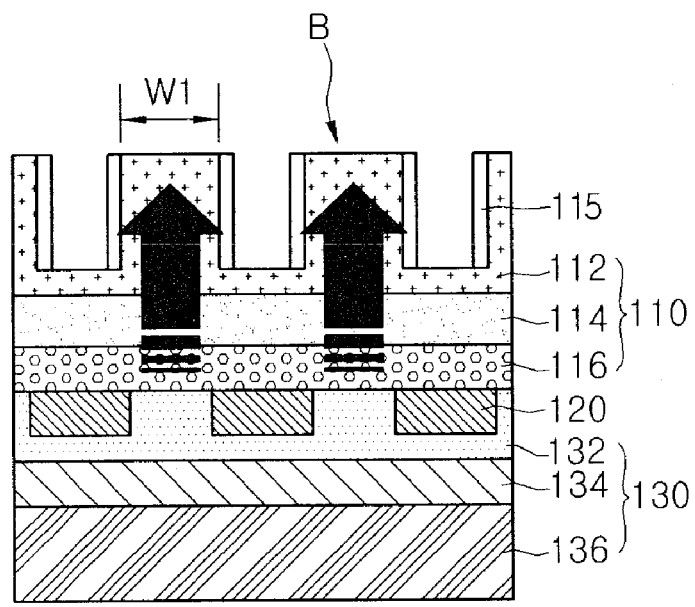
FIGS. 11A-13B are cross-sectional views of light emitting devices according to additional embodiments.
Figure 11B:
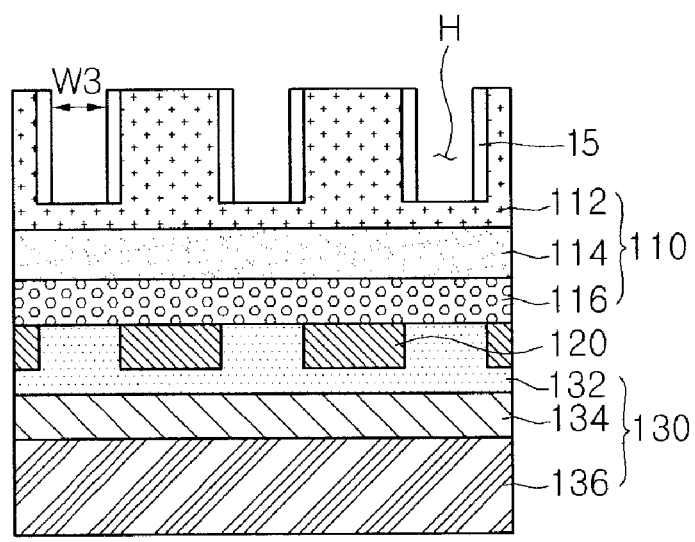

The method of manufacturing a light emitting device may include forming an insulating layer 115 on a side surface of the cylindrical pattern B or the hole pattern H to inhibit leakage current, as shown in FIGS. 11A-11B. The insulating layer 115 may include compounds and complex layers based on oxide, nitride, and fluoride. Further, to obtain the resonator effect in this embodiment, the horizontal width W1 of the cylindrical pattern B or the horizontal width W3 of the hole pattern H may be smaller than the thickness of the light emitting structure 110.

Figure 12A:
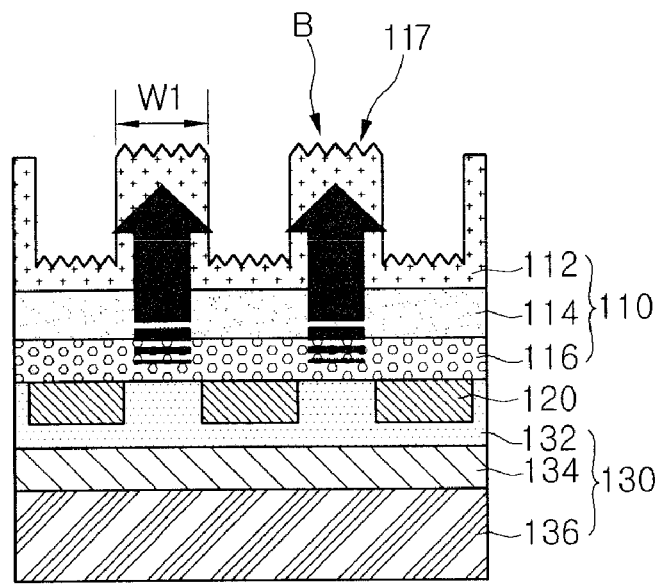
Figure 12B:
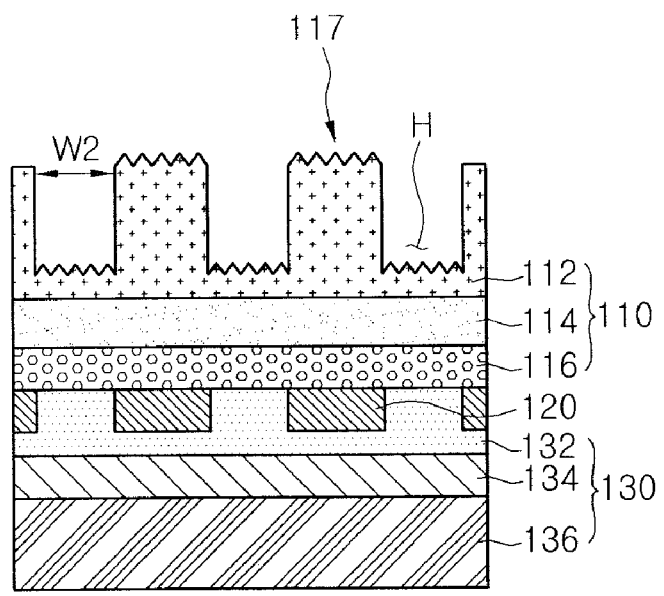

The method of manufacturing a light emitting device may include forming a roughness or a periodic unevenness 117 on the cylindrical pattern B or the hole pattern H, as shown in FIGS. 12A-12B. For example, the roughness or the periodic unevenness 117 may be formed on the cylindrical pattern B or a surface between the cylindrical patterns B; however, embodiments are not limited thereto. An average size of the roughness or the periodic unevenness may be smaller than a size of the cylindrical pattern B or a space between the cylindrical patterns.

Figure 13A:
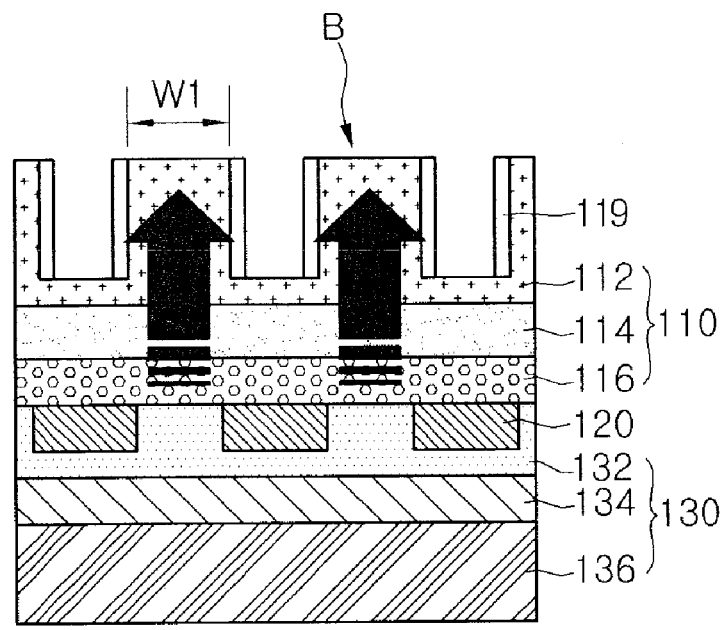
Figure 13B:
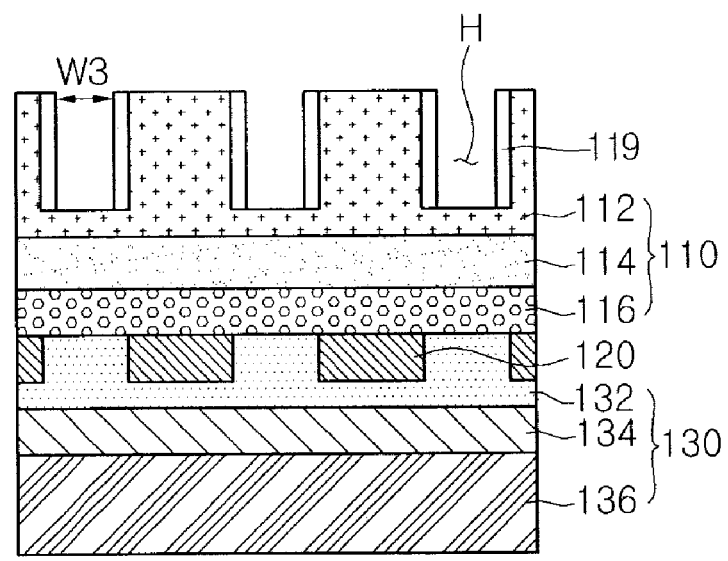

The method of manufacturing a light emitting device may include forming a reflection layer 119 on a side surface of the cylindrical pattern B or the hole pattern H to maximize the resonator effect, as shown in FIGS. 13A-13B. The reflection layer may be formed of Ag, Al, Au, Pt, Ti, and Cr; however, embodiments are not limited thereto. Also, to obtain the resonator effect in this embodiment, the horizontal width W1 of the cylindrical pattern B or the horizontal width W3 of the hole pattern H may be smaller than the thickness of the light emitting structure 110.

A pad (not shown) may be formed on the first conductive type semiconductor layer 112. For example, the pad may be formed on the cylindrical pattern B; however, embodiments are not limited thereto.

According to embodiments disclosed herein, the light extraction efficiency may be improved through a resonator effect by control of current density. By using a resonator light emitting device by control of current density, a light emitting pattern concentrated in a vertical direction may be obtained because improvement of the light extraction efficiency may be achieved through a combination with a vertical vibration mode present in a resonator structure. Further, embodiments disclosed herein provide a light emitting device that may enhance extraction efficiency through a resonator effect regardless of a size of the device.

According to an embodiment disclosed herein, a light emitting device is provided that may include a light emitting structure including a first conductive type semiconductor layer, an active layer, and a second conductive type semiconductor layer; a dielectric pattern on the second conductive type semiconductor layer; a second electrode layer on the second conductive type including the dielectric pattern; and a resonator structure on the light emitting structure.

According to another embodiment disclosed herein, a light emitting device is provided that may include a light emitting structure including a first conductive type semiconductor layer, an active layer, and a second conductive type semiconductor layer; a current blocking layer on the second conductive type semiconductor layer; a second electrode layer on the second conductive type semiconductor layer comprising the current blocking layer; and a light extraction pattern on the light emitting structure.

Figure 14:
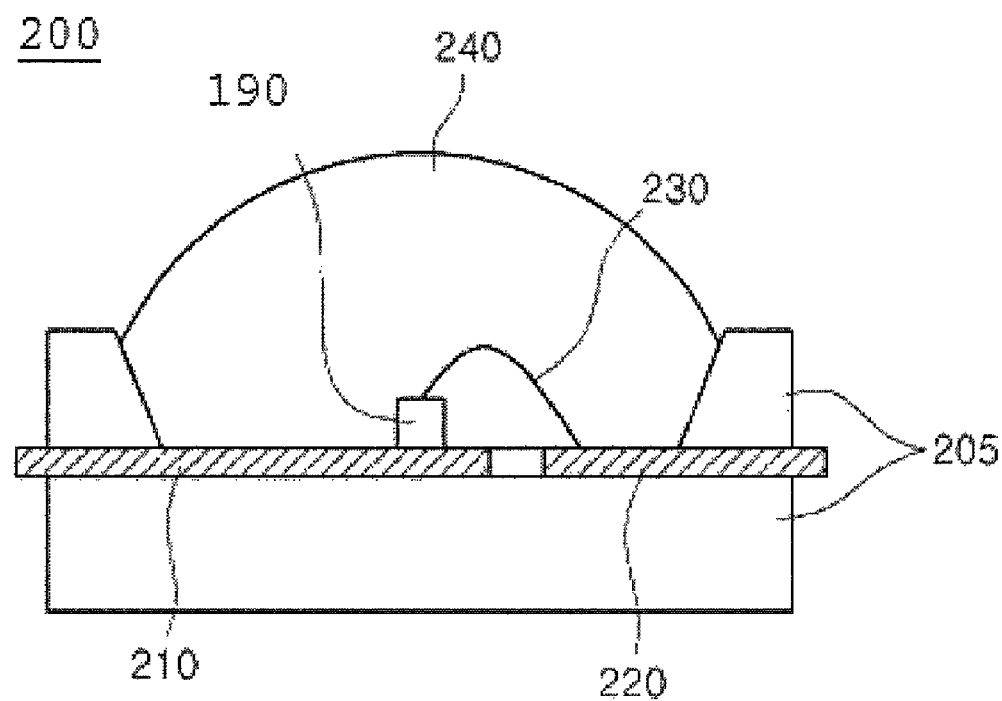
FIG. 14 is a sectional view of an LED package according to an embodiment.

FIG. 14 is a sectional view of an LED package including an LED according to an embodiment.

Referring to FIG. 14, an LED package according to an embodiment includes a body 205, a third electrode layer 210 and a fourth electrode layer 220 disposed in the body 205, an LED 190 disposed in the body 205 and electrically connected to the third electrode layer 210 and the fourth electrode layer 220, and a molding member 240 surrounding the LED 190.

The body 205 may be formed of a silicon material, a synthetic resin material, or a metal material. An inclined surface may be disposed around the LED 190.

The third electrode layer 210 and the fourth electrode layer 220 are electrically separated from each other and supply a power to the LED 190. Also, the third electrode layer 210 and the fourth electrode layer 220 may reflect light generated in the LED 190 to improve light efficiency. In addition, the third electrode layer 210 and the fourth electrode layer 220 may release heat generated in the LED 190 to the outside.

The vertical type LED illustrated in FIG. 1 may be applicable as the LED 190, but is not limited thereto. For example, a lateral type LED may be applicable as the LED 190.

For example, in the lateral type LED, a distance between electrodes are formed is longer than that of between electrodes are not formed, thereby current crowding can be prevented.

The LED 190 may be disposed on the body 205 or on the third electrode layer 210 or the fourth electrode layer 220.

The LED 190 may be electrically connected to the third electrode layer 210 and/or the fourth electrode layer 220 through a wire 300. In this embodiment, the vertical type LED 190 is explained as an example, and one wire 300 may be used as an example, but are not limited thereto.

The molding member 240 may surround the LED 190 to protect the LED 190. Also, a phosphor may be contained in the molding member 240 to vary a wavelength of light emitted from the LED 190.

The LED package according to an embodiment may be applicable to a lighting system. The lighting system may include a lighting unit illustrated in FIG. 15 and a backlight unit illustrated in FIG. 16. In addition, the lighting system may include traffic lights, a vehicle headlight, and a sign.

Figure 15:
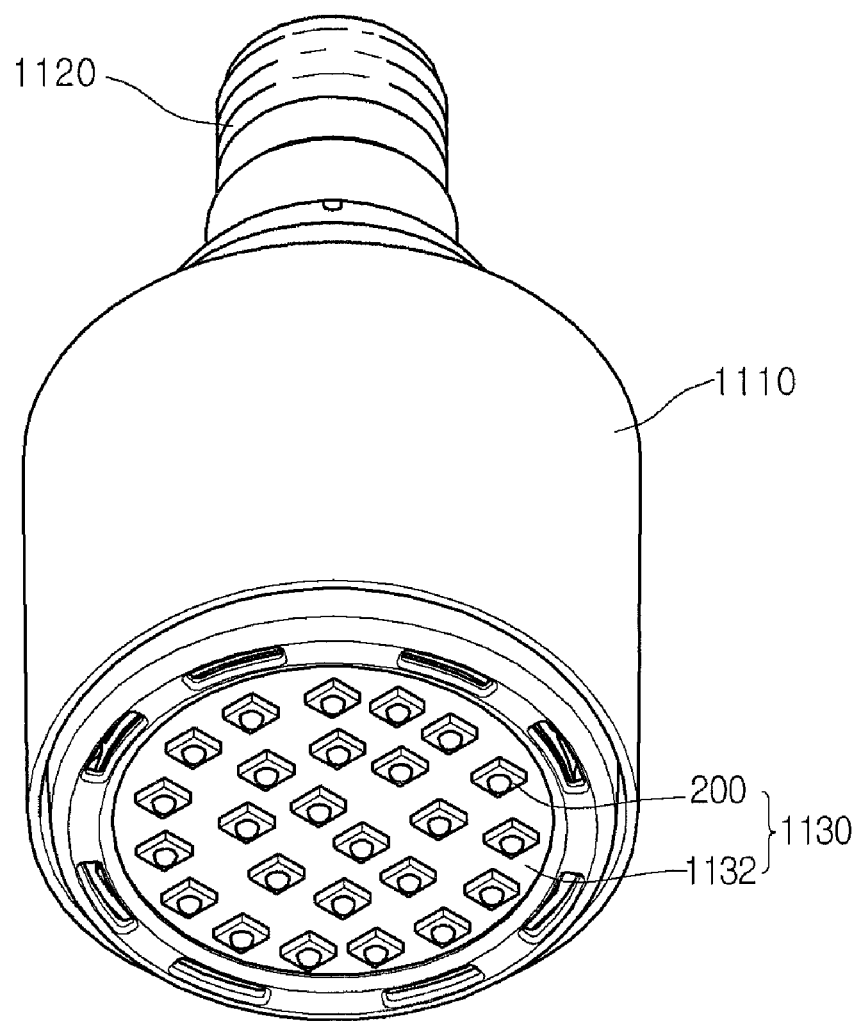
FIG. 15 is a perspective view of a lighting unit according to an embodiment.

FIG. 15 is a perspective view of a lighting unit 1100 according to an embodiment.

Referring to FIG. 15, a lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 200 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The at least one light emitting device package 200 may be mounted on the substrate 1132. The light emitting device package 200 may include at least one light emitting diode 100. The light emitting diode 100 may include a colored light emitting diode that emits red, green, blue, or white light and an UV light emitting diode that emits ultraviolet (UV) light.

The light emitting module 1130 may include a plurality of light emitting device packages 200 to obtain various colors and brightness. For example, a white LED, a red LED, and a green LED may be disposed in combination with each other to secure a high color rendering index (CRI).

The connection terminal 1120 may be electrically connected to the light emitting module 1130 to supply a power. As shown in FIG. 15, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power using an interconnection.

Figure 16:
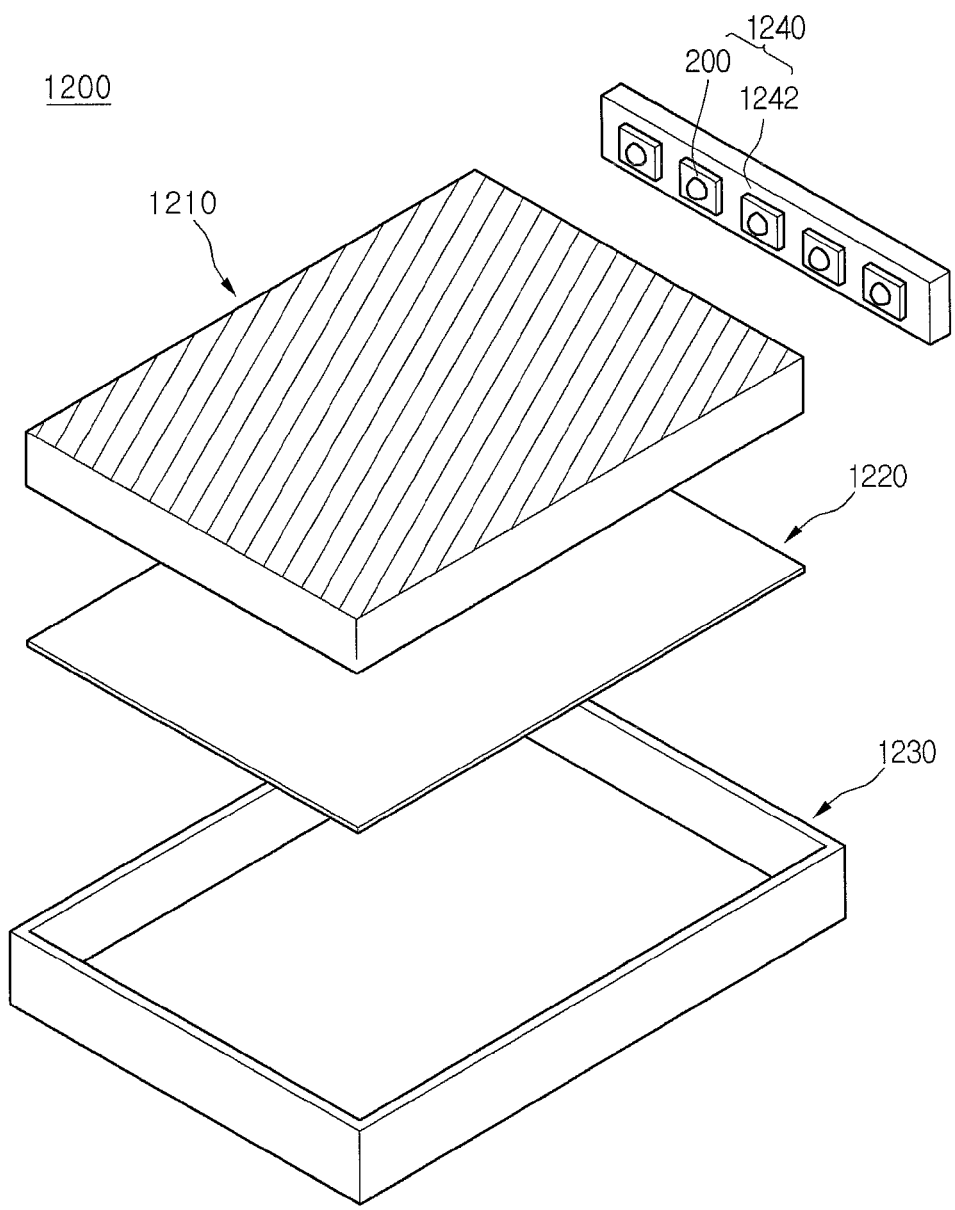
FIG. 16 is an exploded perspective view of a backlight unit according to an embodiment.

FIG. 16 is an exploded perspective view of a backlight unit 1200 according to an embodiment.

A backlight unit 1200 according to an embodiment may include a light guide plate 1210, a light emitting module 1240, a reflective member 1220, and a bottom cover 1230, but is not limited thereto. The light emitting module 1240 may provide light the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of light emitting device packages 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

A light emitting surface of each of the plurality of light emitting device packages 200 may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
an electrode layer;
a plurality of dielectric patterns provided on the electrode layer;
a light emitting structure on the plurality of dielectric patterns and the electrode layer, wherein the light emitting structure comprises a first semiconductor layer, an active layer, and a second semiconductor layer, which are vertically stacked on the plurality of dielectric patterns; and
a resonator structure on the light emitting structure, wherein the resonator structure comprises a recessed structure in the light emitting structure, wherein the recessed structure is not formed in the active layer, wherein the resonator structure comprises a plurality of cylindrical patterns in the light emitting structure, and wherein the plurality of dielectric patterns do not overlap with the plurality of cylindrical patterns of the resonator structure.

2. The light emitting device of claim 1, wherein the first semiconductor layer comprises a first conductive type semiconductor layer.

3. The light emitting device of claim 1, further comprising an insulation layer on a side surface of the recessed structure in the light emitting structure.

4. The light emitting device of claim 1, further comprising a roughness pattern or a periodic unevenness on the recessed structure in the light emitting structure.

5. The light emitting device of claim 1, further comprising a reflection layer on a side surface of the recessed structure in the light emitting structure.

6. A light emitting device, comprising:
an electrode layer;
a plurality of dielectric patterns provided on the electrode layer;
a light emitting structure on the plurality of dielectric patterns and the electrode layer, wherein the light emitting structure comprises a first semiconductor layer, an active layer, and a second semiconductor layer, which are vertically stacked on the plurality of dielectric patterns; and
a resonator structure on the light emitting structure, wherein the resonator structure comprises a recessed structure in the light emitting structure, wherein the resonator structure comprises a plurality of hole patterns, which are formed in the light emitting structure, and wherein the recessed structure is not formed in the active layer, and wherein the plurality of dielectric patterns do not overlap with the plurality of hole patterns of the resonator structure.

7. A light emitting device (LED) package comprising:
an LED of claim 1 or 6; and
a package body containing the LED.

8. A lighting system comprising a light emitting module including a light emitting device (LED) package of claim 7.

9. The light emitting device of claim 1, wherein the recessed structure is formed in the first semiconductor layer.

10. The light emitting device according to claim 2, wherein the recessed structure has a horizontal width smaller than a thickness of the light emitting structure.

11. The light emitting device of claim 6, wherein the recessed structure is formed in the first semiconductor layer.

12. The light emitting device according to claim 6, wherein at least one of the plurality of cylindrical patterns or the plurality of hole patterns has a horizontal width smaller than a thickness of the light emitting structure.

13. The light emitting device according to claim 1, wherein the resonator structure is formed in the first semiconductor layer, and wherein a vertical thickness of the plurality of cylindrical patterns is thicker than a vertical thickness of a remaining portion of the first semiconductor layer having the recess structure.

14. The light emitting device according to claim 6, wherein the resonator structure is formed in the first semiconductor layer, and wherein a vertical thickness of the plurality of hole patterns is thicker than a vertical thickness of a remaining portion of the first semiconductor layer having the recess structure.

* * * * *